(12) United States Patent
Pagaila et al.

(10) Patent No.: US 9,263,361 B2
(45) Date of Patent: Feb. 16, 2016

(54) SEMICONDUCTOR DEVICE HAVING A VERTICAL INTERCONNECT STRUCTURE USING STUD BUMPS

(75) Inventors: Reza A. Pagaila, Singapore (SG);
Byung Tai Do, Singapore (SG);
Shuangwu Huang, Singapore (SG);
Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/446,863

(22) Filed: Apr. 13, 2012

(65) Prior Publication Data

US 2012/0199972 A1    Aug. 9, 2012

Related U.S. Application Data

(63) Continuation of application No. 12/492,360, filed on Jun. 26, 2009, now Pat. No. 8,193,034, which is a continuation-in-part of application No. 11/595,638, filed on Nov. 10, 2006, now Pat. No. 8,174,119, and a continuation-in-part of application No. 12/406,049, filed on Mar. 17, 2009, now Pat. No. 8,133,762.

(51) Int. Cl.
*H01L 23/31* (2006.01)
*H01L 21/683* (2006.01)
(Continued)

(52) U.S. Cl.
CPC ........ *H01L 23/3128* (2013.01); *H01L 21/6835* (2013.01); *H01L 24/19* (2013.01);
(Continued)

(58) Field of Classification Search
USPC .......... 257/686, 737, 738, E21.503; 438/108, 438/613

IPC .................................................. H01L 23/3128
See application file for complete search history.

(56) References Cited

U.S. PATENT DOCUMENTS 4,681,795 A    7/1987    Tuckerman
5,250,843 A    10/1993   Eichelberger
(Continued)

FOREIGN PATENT DOCUMENTS

TW    200901411 A    1/2009
TW    200926312 A    6/2009
(Continued)

OTHER PUBLICATIONS

Riley, George A. "Stud Bump Flip Chip" FlipChips Dot Com, Dec. 2000, Tutorial 3.

*Primary Examiner* — Marcos D Pizarro
(74) *Attorney, Agent, or Firm* — Robert D. Atkins; Patent Law Group: Atkins and Associates, P.C.

(57) ABSTRACT

A semiconductor device is made by forming a conductive layer over a temporary carrier. The conductive layer includes a wettable pad. A stud bump is formed over the wettable pad. The stud bump can be a stud bump or stacked bumps. A semiconductor die is mounted to the carrier. An encapsulant is deposited over the semiconductor die and around the stud bump. A first interconnect structure is formed over a first surface of the encapsulant. The first interconnect structure includes a first IPD and is electrically connected to the stud bump. The carrier is removed. A second interconnect structure is formed over a second surface of encapsulant opposite the first interconnect structure. The second interconnect structure includes a second IPD. The first or second IPD includes a capacitor, resistor, or inductor. The semiconductor devices are stackable and electrically connected through the stud bump.

15 Claims, 8 Drawing Sheets

(51) Int. Cl.
*H01L 23/00* (2006.01)
*H01L 25/10* (2006.01)
*H01L 23/538* (2006.01)

(52) U.S. Cl.
CPC .............. *H01L 24/73* (2013.01); *H01L 24/86* (2013.01); *H01L 24/97* (2013.01); *H01L 25/105* (2013.01); *H01L 23/5389* (2013.01); *H01L 24/48* (2013.01); *H01L 2221/68345* (2013.01); *H01L 2224/0401* (2013.01); *H01L 2224/04105* (2013.01); *H01L 2224/12105* (2013.01); *H01L 2224/16* (2013.01); *H01L 2224/20* (2013.01); *H01L 2224/48091* (2013.01); *H01L 2224/48227* (2013.01); *H01L 2224/73265* (2013.01); *H01L 2224/97* (2013.01); *H01L 2225/1035* (2013.01); *H01L 2225/1058* (2013.01); *H01L 2924/01004* (2013.01); *H01L 2924/014* (2013.01); *H01L 2924/01013* (2013.01); *H01L 2924/01024* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04953* (2013.01); *H01L 2924/09701* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/15174* (2013.01); *H01L 2924/15184* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/30105* (2013.01)

(56) References Cited

U.S. PATENT DOCUMENTS

| | | | |
|---|---|---|---|
| 5,353,498 A | 10/1994 | Fillion et al. | |
| 5,381,039 A * | 1/1995 | Morrison | 257/701 |
| 5,528,462 A | 6/1996 | Pendse | |
| 5,764,486 A | 6/1998 | Pendse | |
| 5,768,776 A | 6/1998 | Pendse | |
| 5,818,114 A | 10/1998 | Pendse et al. | |
| 5,841,193 A | 11/1998 | Eichelberger | |
| 5,874,780 A | 2/1999 | Murakami | |
| 5,920,200 A | 7/1999 | Pendse et al. | |
| 5,987,744 A | 11/1999 | Lan et al. | |
| 6,059,894 A | 5/2000 | Pendse | |
| 6,159,420 A | 12/2000 | Akimoto | |
| 6,259,163 B1 | 7/2001 | Ohuchi et al. | |
| 6,417,573 B1 | 7/2002 | Pendse | |
| 6,737,295 B2 | 5/2004 | Pendse et al. | |
| 6,780,682 B2 | 8/2004 | Pendse | |
| 6,784,530 B2 | 8/2004 | Sugaya et al. | |
| 6,815,252 B2 | 11/2004 | Pendse | |
| 6,815,254 B2 | 11/2004 | Mistry et al. | |
| 6,828,220 B2 | 12/2004 | Pendse et al. | |
| 6,940,178 B2 | 9/2005 | Kweon et al. | |
| 6,995,041 B2 | 2/2006 | Connell et al. | |
| 7,011,988 B2 | 3/2006 | Forcier | |
| 7,033,859 B2 | 4/2006 | Pendse | |
| 7,034,391 B2 | 4/2006 | Pendse | |
| 7,057,269 B2 | 6/2006 | Karnezos | |
| 7,446,419 B1 | 11/2008 | Lin et al. | |
| 7,619,901 B2 | 11/2009 | Eichelberger et al. | |
| 7,713,782 B2 | 5/2010 | Pendse | |
| 8,193,035 B2 | 6/2012 | Pendse | |
| 8,778,738 B1 | 7/2014 | Lin et al. | |
| 2001/0013853 A1 | 8/2001 | Suzuki | |
| 2001/0038151 A1 | 11/2001 | Takahashi et al. | |
| 2003/0071352 A1 | 4/2003 | Ohuchi et al. | |
| 2003/0151140 A1 | 8/2003 | Nishiyama et al. | |
| 2003/0189248 A1 | 10/2003 | Estacio et al. | |
| 2004/0113272 A1 | 6/2004 | Chen et al. | |
| 2004/0145044 A1 | 7/2004 | Sugaya et al. | |
| 2004/0178499 A1 * | 9/2004 | Mistry et al. | 257/734 |
| 2004/0262774 A1 * | 12/2004 | Kang et al. | 257/777 |
| 2005/0003578 A1 | 1/2005 | Wu | |
| 2005/0006739 A1 | 1/2005 | Howard et al. | |
| 2005/0077632 A1 | 4/2005 | Hedler et al. | |
| 2005/0109455 A1 | 5/2005 | Bai | |
| 2005/0161804 A1 | 7/2005 | Iijima et al. | |
| 2005/0230848 A1 * | 10/2005 | Nakatani et al. | 257/783 |
| 2005/0236709 A1 | 10/2005 | Eng et al. | |
| 2005/0275096 A1 | 12/2005 | Zeng et al. | |
| 2006/0055032 A1 | 3/2006 | Chang et al. | |
| 2006/0216868 A1 | 9/2006 | Yang et al. | |
| 2006/0244157 A1 | 11/2006 | Carson | |
| 2006/0267157 A1 | 11/2006 | Edwards et al. | |
| 2007/0108583 A1 | 5/2007 | Shim et al. | |
| 2007/0139976 A1 | 6/2007 | DeRochemont | |
| 2008/0023830 A1 | 1/2008 | Chang et al. | |
| 2008/0111233 A1 | 5/2008 | Pendse | |
| 2008/0136035 A1 | 6/2008 | Aggarwal et al. | |
| 2008/0296759 A1 | 12/2008 | Ramakrishna et al. | |
| 2008/0315372 A1 | 12/2008 | Kuan et al. | |
| 2009/0008765 A1 | 1/2009 | Yamano et al. | |
| 2009/0014859 A1 | 1/2009 | Jeung et al. | |
| 2009/0140442 A1 | 6/2009 | Lin | |
| 2009/0152715 A1 | 6/2009 | Shim et al. | |
| 2009/0170241 A1 | 7/2009 | Shim et al. | |
| 2009/0236686 A1 | 9/2009 | Shim et al. | |

FOREIGN PATENT DOCUMENTS

| | | |
|---|---|---|
| TW | 200926323 A | 6/2009 |
| WO | 2007069606 A1 | 6/2007 |

* cited by examiner

SEMICONDUCTOR DEVICE HAVING A VERTICAL INTERCONNECT STRUCTURE USING STUD BUMPS

CLAIM TO DOMESTIC PRIORITY

The present application is a continuation of U.S. patent application Ser. No. 12/492,360, now U.S. Pat. No. 8,193,034, filed Jun. 26, 2009, which is a continuation-in-part of U.S. patent application Ser. No. 11/595,638, filed Nov. 10, 2006 now U.S. Pat. No. 8,174,119, and is also a continuation-in-part of U.S. patent application Ser. No. 12/406,049, filed Mar. 17, 2009, now U.S. Pat. No. 8,133,762.

FIELD OF THE INVENTION

The present invention relates in general to semiconductor devices and, more particularly, to a semiconductor device and method of forming a vertical interconnect structure using stud bumps and integrated passive devices (IPD) for fan-out wafer level chip scale packages (FO-WSCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, IPDs are often contained within the semiconductor device. Examples of IPDs include resistors, capacitors, and inductors. A typical RF system requires multiple IPDs in one or more semiconductor packages to perform the necessary electrical functions.

The electrical interconnection between semiconductor packages can be accomplished with conductive through silicon vias (TSV) or through hole vias (THV). To form TSVs or THVs, the semiconductor die is singulated from the wafer and placed on a temporary carrier. A via is cut through the semiconductor material or peripheral region around each semiconductor die while the die are mounted to the carrier. The vias are then filled with an electrically conductive material, for example, copper deposition through an electroplating process.

The TSV and THV formation involves considerable time for the via filling due to its small area. The fully-filled TSV can produce high stress between vias leading to cracking and lower reliability. The equipment needed for electroplating, e.g., plating bath, and sidewall passivation increases manufacturing cost. In addition, voids may be formed within the vias, which causes defects and reduces reliability of the device. TSV and THV can be a slow and costly approach to make vertical electrical interconnections in semiconductor packages. These interconnect schemes also have problems with production yield, large package size, and process cost management.

SUMMARY OF THE INVENTION

A need exists to provide a vertical interconnect structure for stacked semiconductor devices. Accordingly, in one embodiment, the present invention is a method of making a semiconductor device comprising the steps of providing a semiconductor die, forming a conductive layer outside a footprint of the semiconductor die, forming a first stud bump over the conductive layer, depositing an encapsulant over the semiconductor die and around the first stud bump, forming a first interconnect structure over a first surface of the encapsulant, and forming a second interconnect structure over a second surface of encapsulant opposite the first interconnect structure. The first interconnect structure includes a first IPD electrically connected to the first stud bump.

In another embodiment, the present invention is a method of making a semiconductor device comprising the steps of providing a semiconductor die or component, forming a vertical interconnect structure around the semiconductor die or component, depositing an encapsulant over the semiconductor die or component and around the vertical interconnect structure, forming a first interconnect structure over a first surface of the encapsulant, and forming a second interconnect structure over a second surface of encapsulant opposite the first interconnect structure.

In another embodiment, the present invention is a method of making a semiconductor device comprising the steps of providing a semiconductor die or component, forming a vertical interconnect structure around the semiconductor die or component, depositing an encapsulant over the semiconductor die or component and around the vertical interconnect structure, and forming a first interconnect structure over a first surface of the encapsulant. The first interconnect structure includes a first IPD.

In another embodiment, the present invention is a semiconductor device comprising a semiconductor die or component and vertical interconnect structure formed around the semiconductor die or component. An encapsulant is deposited over the semiconductor die or component and around the vertical interconnect structure. A first interconnect structure is formed over a first surface of the encapsulant. The first interconnect structure includes a first IPD.

DETAILED DESCRIPTION OF THE DRAWINGS

Figure 1:
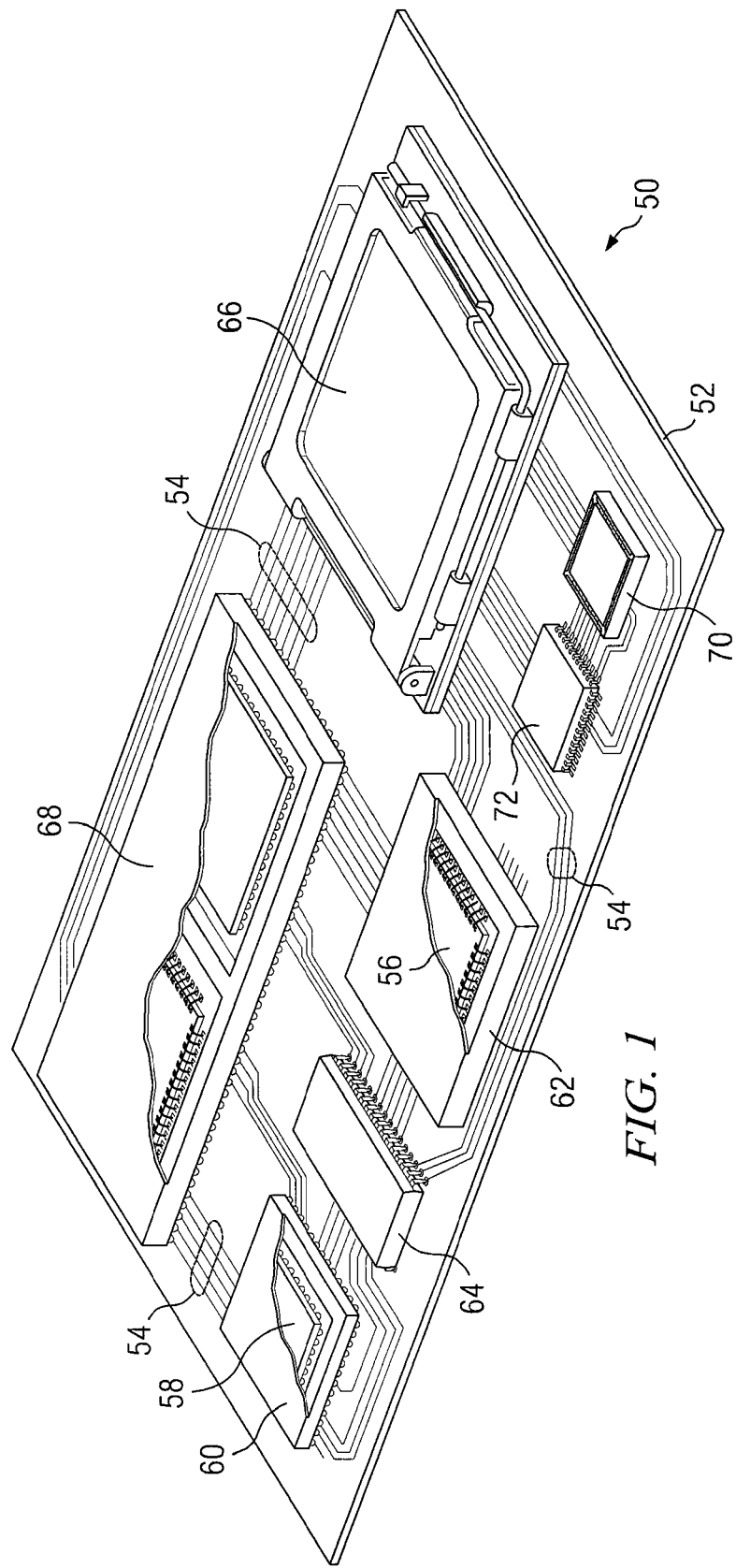
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
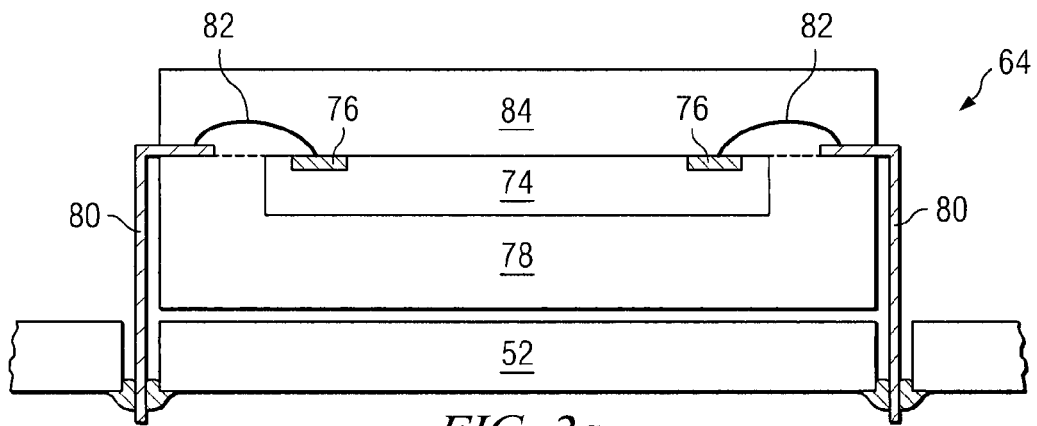
FIGS. 2a-2c illustrate further detail of the representative semiconductor packages mounted to the PCB.
Figure 2B:
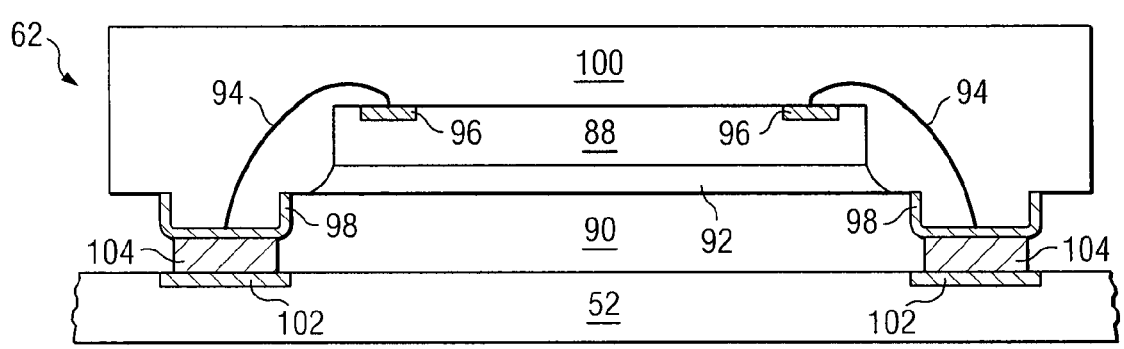
Figure 2C:
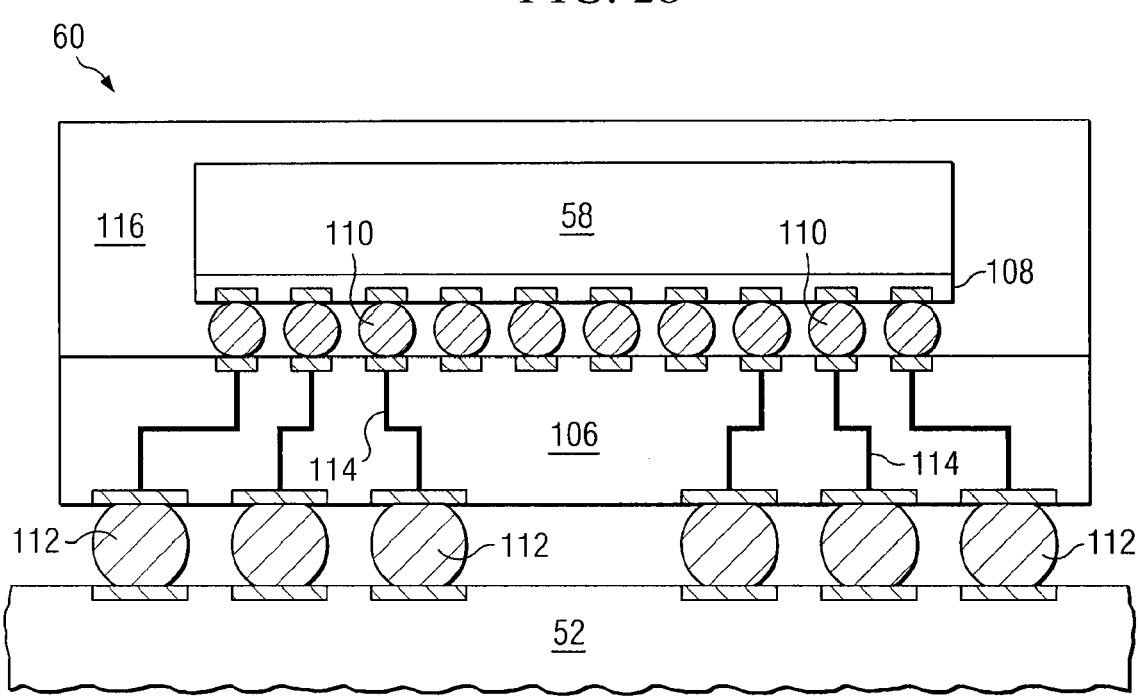

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
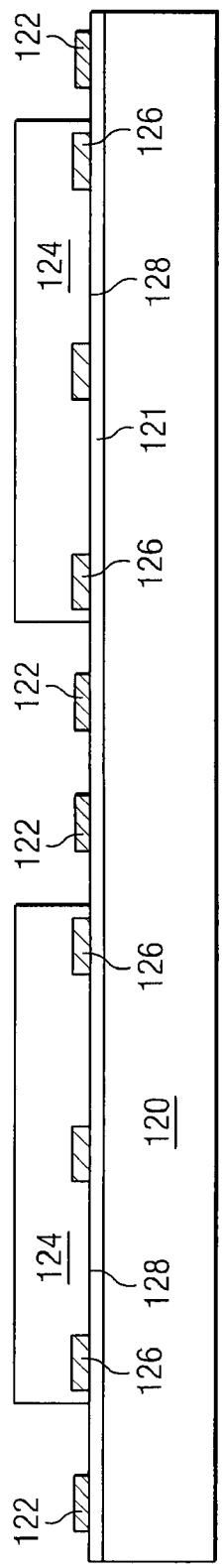
FIGS. 3a-3h illustrate a process of forming a vertical interconnect structure using stud bumps.

FIGS. 3a-3h illustrate a process of forming a vertical interconnect structure with stud bumps and IPD for a FO-WLCSP. In FIG. 3a, a temporary substrate or carrier 120 contains a base material such as silicon, polymer, polymer composite, metal, ceramic, glass, glass epoxy, beryllium oxide, or other suitable low-cost, rigid material for structural support. An optional interface layer 121 can be formed over carrier 120 as an etch-stop. An electrically conductive layer 122 is formed over interface layer 121 and carrier 120 using patterning with PVD, CVD, sputtering, electrolytic plating, electroless plating process, or other suitable metal deposition process. Conductive layer 122 can be one or more layers of Al, Cu, Sn, Ni, Au, Ag, W, poly-silicon, or other suitable electrically conductive material. Conductive layer 122 includes wettable contact pads for later formation of stud bumps. In one embodiment, the wettable contact pads of conductive layer 122 are pre-plated on interface layer 121.

A plurality of semiconductor die or components 124 is mounted to interface layer 121 in a flipchip arrangement with contact pads 126 oriented downward over carrier 120. Semiconductor die 124 each include an active surface 128 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement baseband analog circuits or digital circuits, such as digital signal processor (DSP), ASIC, memory, or other signal processing circuit. Semiconductor die 124 may also contain IPD, such as inductors, capacitors, and resistors, for RF signal processing. In another embodiment, a discrete semiconductor component can be mounted to interface layer 121.

Figure 3B:
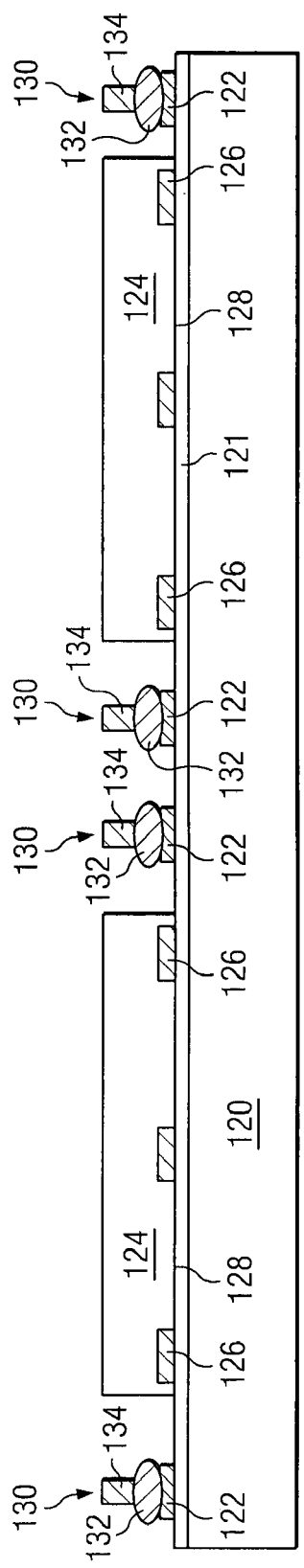

In FIG. 3b, a plurality of stud bumps or posts 130 are formed over the wettable contact pads of conductive layer 122. In one embodiment, a wire-bonding machine can form stud bumps 130. Stud bumps 130 have a height ranging from 2-120 micrometers (μm).

Figure 3C:
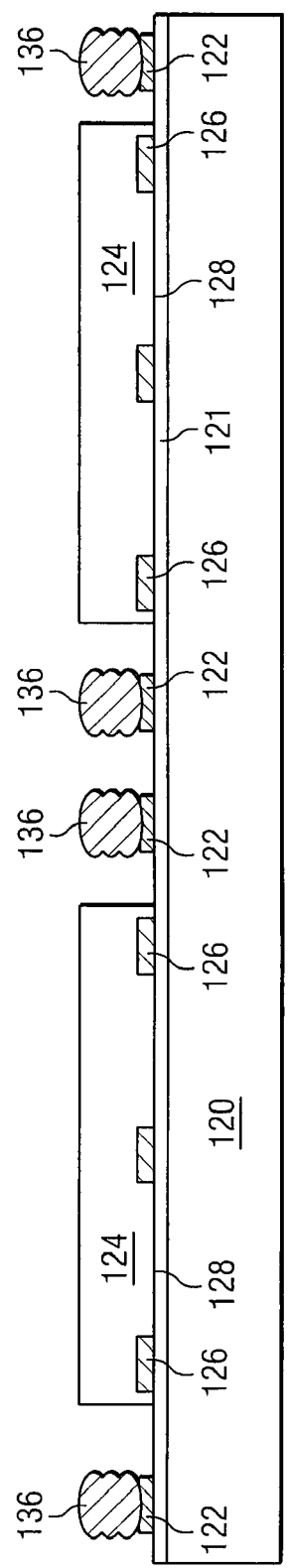
Figure 3D:
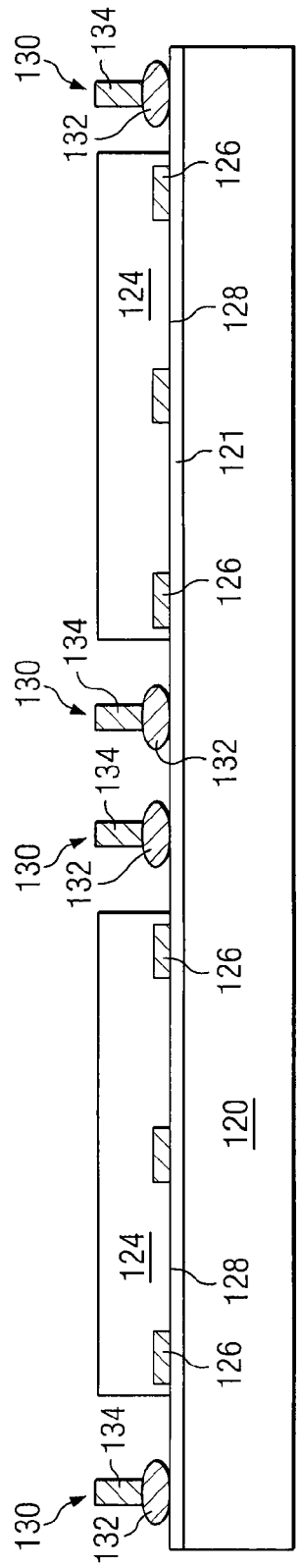

FIG. 3b shows stud bumps 130 implemented as stud bumps, including bump portion 132 and stud portion 134. In another embodiment, stud bumps 130 can be formed with stacked bumps 136, as shown in FIG. 3c. Stud bumps 130 can also be formed without conductive layer 122, as shown in FIG. 3d. In any case, the formation of stud bumps 130 use a simple, low-cost manufacturing process.

Figure 3E:
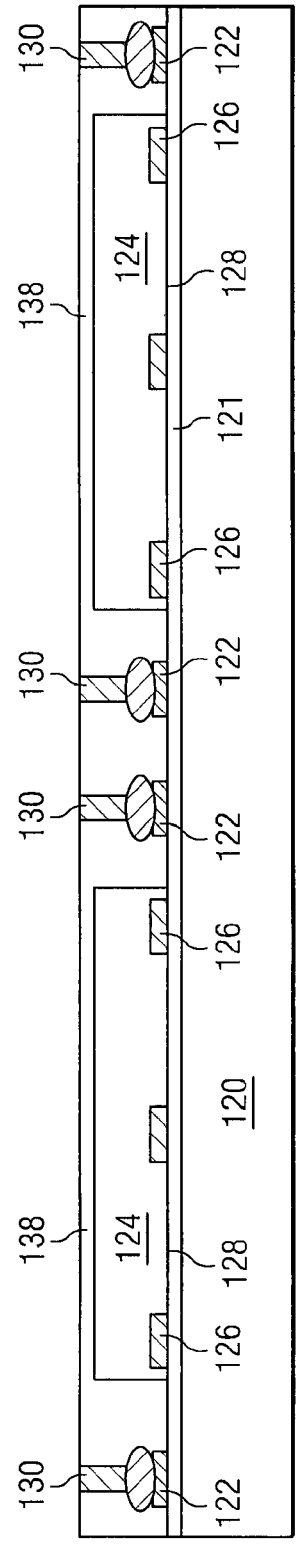

FIG. 3e shows an encapsulant or molding compound 138 deposited over semiconductor die 124 and stud bumps 130 using a paste printing, compressive molding, transfer molding, liquid encapsulant molding, vacuum lamination, or other suitable applicator. Encapsulant 138 can be polymer composite material, such as epoxy resin with filler, epoxy acrylate with filler, or polymer with proper filler. Encapsulant 138 is non-conductive and environmentally protects the semiconductor device from external elements and contaminants. Encapsulant 138 undergoes grinding or plasma etching to planarize the surface and expose stud bumps 130. Alternatively, the height of stud bumps 130 can be less than the thickness of semiconductor die 124 (with die facing downward). After performing encapsulation, both encapsulant and the backside of semiconductor die 124 undergo grinding or planarization until exposing stud bumps 130. By doing so, stud bumps 130 have more reliability to withstand encapsulant flow, the materials cost of the stud bumps can be reduced, and total package height can be reduced.

Figure 3F:
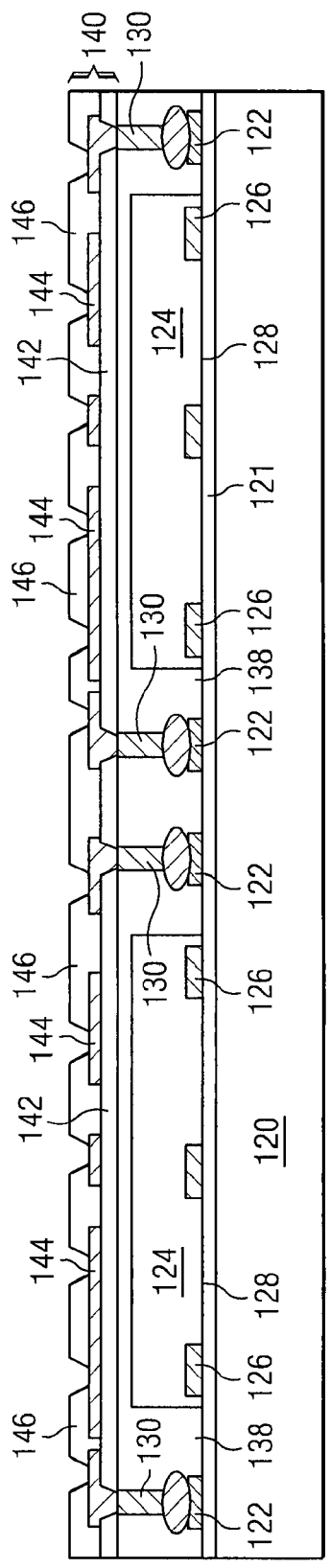

In FIG. 3f, a topside build-up interconnect structure 140 is formed over a first surface of encapsulant 138. The build-up interconnect structure 140 includes an insulating or passivation layer 142 formed by PVD, CVD, printing, spin coating, spray coating, sintering, or thermal oxidation. The passivation layer 142 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of passivation layer 142 is removed by an etching process to expose stud bumps 130.

An electrically conductive layer 144 is formed over insulating layer 142 and stud bumps 130 using patterning with PVD, CVD, sputtering, electrolytic plating, electroless plating process, or other suitable metal deposition process. Conductive layer 144 can be one or more layers of Al, Cu, Sn, Ni, Au, Ag, or other suitable electrically conductive material. One portion of conductive layer 144 is electrically connected to stud bumps 130. Other portions of conductive layer 144 can be electrically common or electrically isolated depending on the design and function of the semiconductor device.

An insulating or passivation layer 146 is formed over passivation layer 142 and conductive layer 144 using PVD, CVD, printing, spin coating, spray coating, sintering, or thermal oxidation. The passivation layer 146 can be one or more layers of SiO2, Si3N4, SiON, Ta2O5, Al2O3, or other material having similar insulating and structural properties. A portion of passivation layer 146 is removed by an etching process to expose conductive layer 144.

Figure 3G:
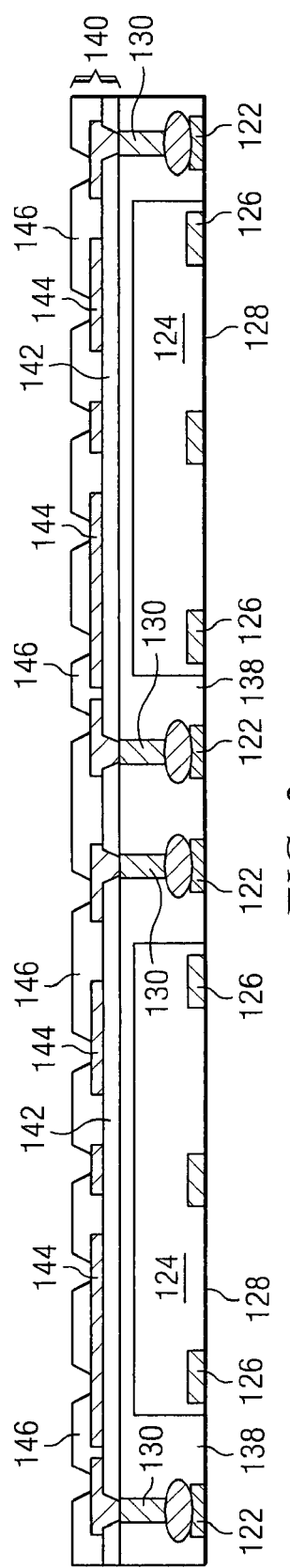

In FIG. 3g, carrier 120 and interface layer 121 are removed by chemical etching, mechanical peel-off, CMP, mechanical grinding, thermal bake, laser scanning, or wet stripping. Conductive layer 122 and contact pads 126 of semiconductor die 124 are exposed following removal of carrier 120 and interface layer 121.

Figure 3H:
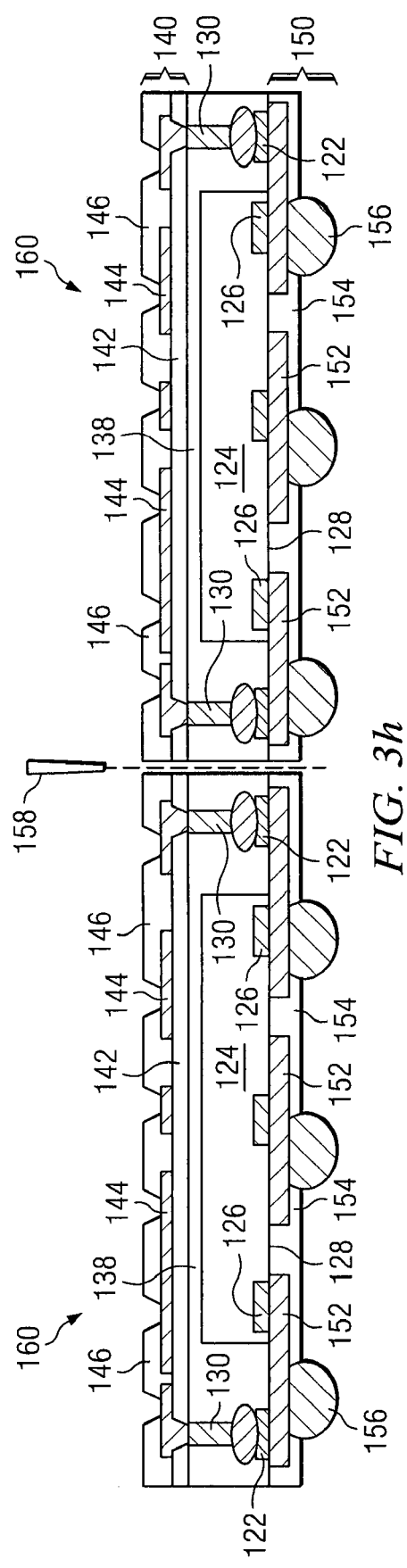

In FIG. 3h, a bottom-side build-up interconnect structure 150 is formed over a second surface of encapsulant 138, opposite topside build-up interconnect structure 140, and a front surface of semiconductor die 124. The build-up interconnect structure 150 includes an electrically conductive layer 152 formed using patterning with PVD, CVD, sputtering, electrolytic plating, electroless plating process, or other suitable metal deposition process. Conductive layer 152 can be one or more layers of Al, Cu, Sn, Ni, Au, Ag, or other suitable electrically conductive material. One portion of conductive layer 152 is electrically connected to stud bumps 130 and contact pads 126 of semiconductor die 124. Other portions of conductive layer 152 can be electrically common or electrically isolated depending on the design and function of the semiconductor device.

An insulating or passivation layer 154 is formed over conductive layer 152 and active surface 128 of semiconductor die 124 using PVD, CVD, printing, spin coating, spray coating, sintering, or thermal oxidation. The passivation layer 154 can be one or more layers of SiO2, Si3N4, SiON, Ta2O5, Al2O3, or other material having similar insulating and structural properties. A portion of insulating layer 154 is removed by an etching process to expose conductive layer 152.

Figure 4:
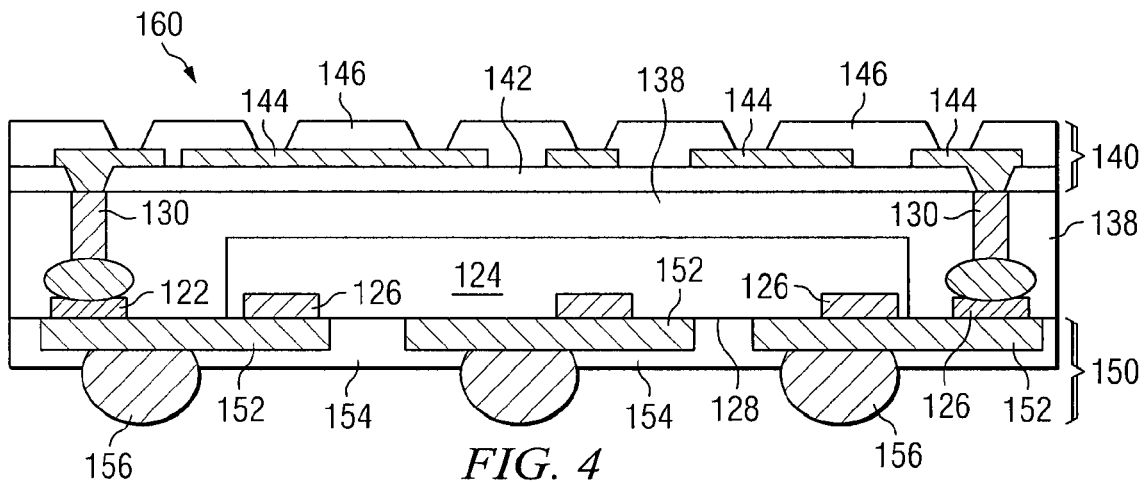
FIG. 4 illustrates the semiconductor device with vertical interconnect structure having stud bumps.
Figure 5:
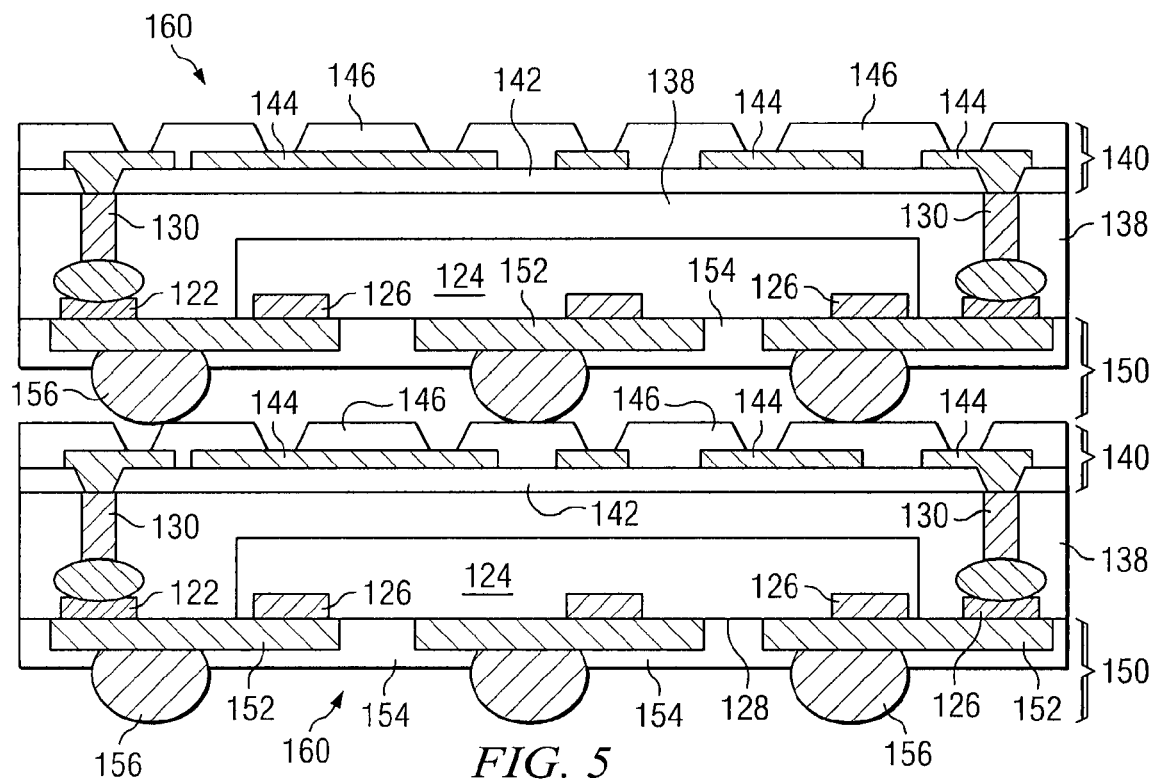
FIG. 5 illustrates stacked semiconductor devices electrically interconnected with the stud bumps.

An electrically conductive bump material is deposited over conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 156. In some applications, bumps 156 are reflowed a second time to improve electrical contact to conductive layer 152. The bumps can also be compression bonded to conductive layer 152. Bumps 156 represent one type of interconnect structure that can be formed over conductive layer 152. The interconnect structure can also use bond wires, conductive paste, stud bump, micro bump, or other electrical interconnect Semiconductor die 124 are singulated with saw blade or laser cutting tool 158 into individual semiconductor devices 160, such as shown in FIG. 4. After singulation, the individual semiconductor devices 160 can be stacked, as shown in FIG. 5. Stud bumps 130 provide vertical, z-direction interconnect between topside build-up interconnect layer 140 and bottom-side build-up interconnect layer 150. Conductive layer 144 is electrically connected through stud bumps 130 to conductive layer 152 and contact pads 126 of each semiconductor device 160.

Figure 6:
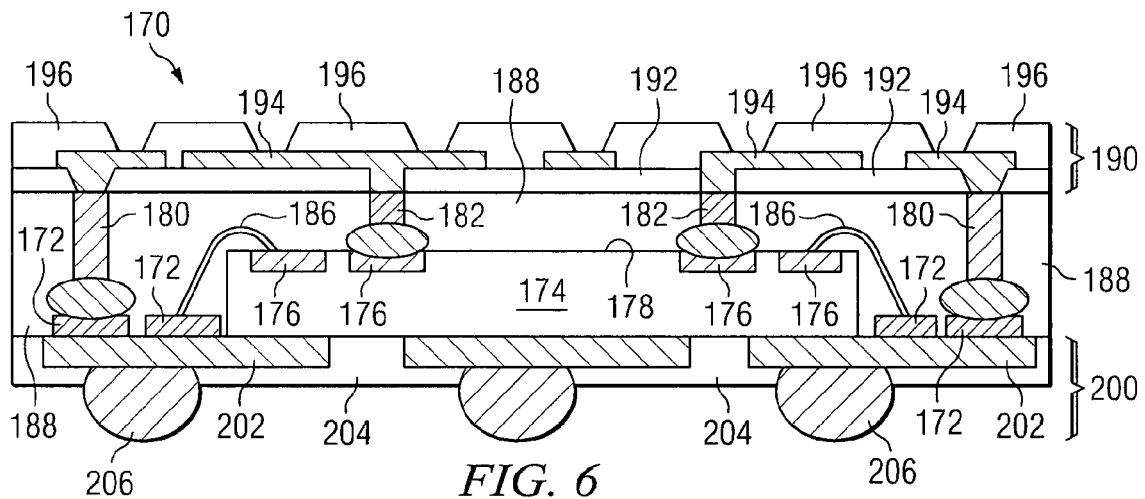
FIG. 6 illustrates the semiconductor device with stud bumps and die having upward facing active surface.

FIG. 6 illustrates an embodiment of the vertical interconnect structure with the semiconductor die having an upward facing active surface. Similar to the process described in FIGS. 3a-3h, semiconductor device 170 uses a temporary substrate or carrier with an optional interface layer, which operates as an etch-stop layer. An electrically conductive layer 172 is formed over the carrier using patterning with PVD, CVD, sputtering, electrolytic plating, electroless plating process, or other suitable metal deposition process. Conductive layer 172 can be one or more layers of Al, Cu, Sn, Ni, Au, Ag, W, poly-silicon, or other suitable electrically conductive material. Conductive layer 172 includes wettable contact pads for later formation of the stud bumps.

A plurality of semiconductor die or components 174 is mounted to the carrier in a flipchip arrangement with contact pads 176 oriented upward. Semiconductor die 174 includes active surface 178 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 178 to implement baseband analog circuits or digital circuits, such as DSP, ASIC, memory, or other signal processing circuit. Semiconductor die 174 may also contain IPD, such as inductors, capacitors, and resistors, for RF signal processing. In another embodiment, a discrete semiconductor component is mounted to the carrier or interface layer.

A plurality of stud bumps 180 is formed over the wettable contact pads of conductive layer 172. In addition, a plurality of stud bumps 182 is formed over contact pads 176 of semiconductor die 174. Stud bumps 180-182 are formed by stud bumping process using a wire-bonding machine. Stud bumps 180-182 can be Cu, Al, W, Au, solder, or other suitable electrically conductive material. In one embodiment, stud bumps 180-182 are implemented as stud bumps. Alternatively, stud bumps 180-182 can be formed with stacked bumps, similar to FIG. 3c. Bond wires 186 are electrically connected between contact pads 176 and conductive layer 172.

An encapsulant or molding compound 188 is deposited over semiconductor die 174 and stud bumps 180-182 using a paste printing, compressive molding, transfer molding, liquid encapsulant molding, vacuum lamination, or other suitable applicator. Encapsulant 188 can be polymer composite material, such as epoxy resin with filler, epoxy acrylate with filler, or polymer with proper filler. Encapsulant 188 is non-conductive and environmentally protects the semiconductor device from external elements and contaminants. Encapsulant 188 undergoes grinding or plasma etching to planarize the surface and expose stud bumps 180-182.

A topside build-up interconnect structure 190 is formed over a first surface of encapsulant 188. The build-up interconnect structure 190 includes an insulating or passivation layer 192 formed by PVD, CVD, printing, spin coating, spray coating, sintering, or thermal oxidation. A portion of passivation layer 192 is removed by an etching process to expose stud bumps 180-182. An electrically conductive layer 194 is formed over passivation layer 192 and stud bumps 180-182. Portions of conductive layer 194 are electrically connected to stud bumps 180-182, respectively. Other portions of conductive layer 194 can be electrically common or electrically isolated depending on the design and function of the semiconductor device. An insulating or passivation layer 196 is formed over passivation layer 192 and conductive layer 194. A portion of insulating layer 196 is removed by an etching process to expose conductive layer 194.

The carrier and interface layer are removed by chemical etching, mechanical peel-off, CMP, mechanical grinding, thermal bake, laser scanning, or wet stripping. A bottom-side build-up interconnect structure 200 is formed over a second surface of encapsulant 188, opposite topside build-up interconnect structure 190, and a back surface of semiconductor die 174. An electrically conductive layer 202 is formed over conductive layer 172 and the back surface of semiconductor die 174. One portion of conductive layer 202 is electrically connected to stud bumps 180. Other portions of conductive layer 202 can be electrically common or electrically isolated depending on the design and function of the semiconductor device. An insulating or passivation layer 204 is formed over conductive layer 202 and the back surface of semiconductor die 174. A portion of insulating layer 204 is removed by an etching process to expose conductive layer 202.

An electrically conductive bump material is deposited over conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 202 using a suitable attachment or bonding process. In one embodiment, the bump material is reflowed by heating the material above its melting point to form spherical balls or bumps 206. In some applications, bumps 206 are reflowed a second time to improve electrical contact to conductive layer 202. The bumps can also be compression bonded to conductive layer 202. Bumps 206 represent one type of interconnect structure that can be formed over conductive layer 202. The interconnect structure can also use bond wires, conductive paste, stud bump, micro bump, or other electrical interconnect Semiconductor device 170 is stackable. Stud bumps 180-182 provide vertical, z-direction interconnect between topside build-up interconnect layer 190 and bottom-side build-up interconnect layer 200. Conductive layer 194 is electrically connected through stud bumps 180-182 to conductive layer 202, contact pads 176, and bond wires 186 of semiconductor device 170.

Figure 7:
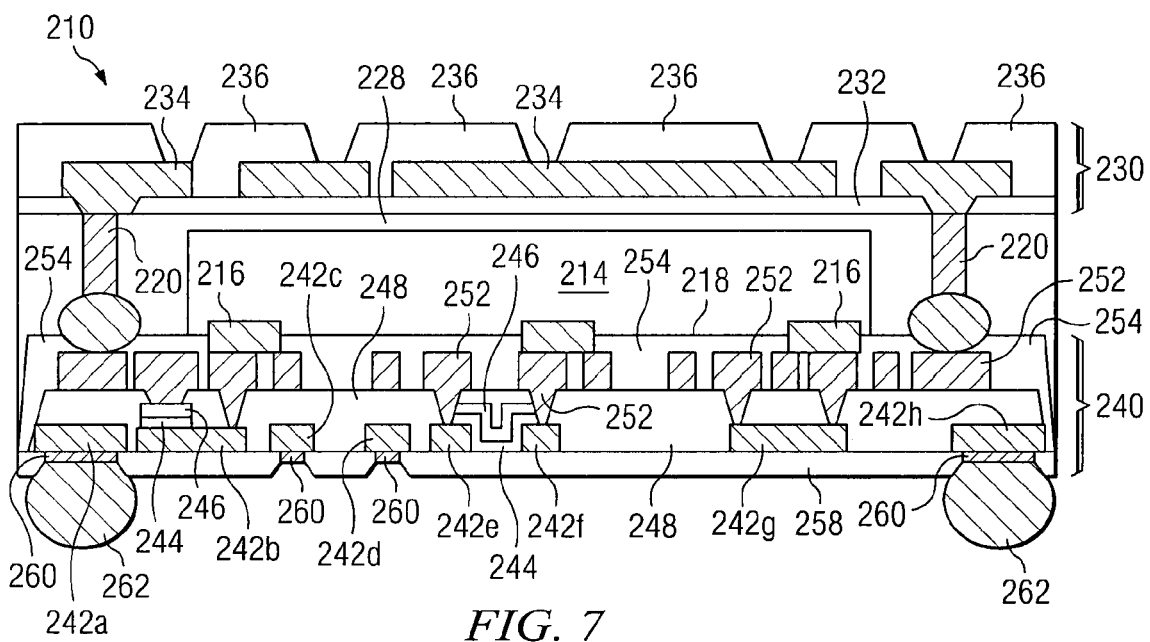
FIG. 7 illustrates the semiconductor device with IPD formed in a bottom-side interconnect structure.

FIG. 7 illustrates an embodiment of the vertical interconnect structure with one or more IPDs formed in the bottom-side interconnect structure before encapsulation. In this case, a bottom-side build-up interconnect structure 240 is formed over the carrier. An electrically conductive layer 242 is patterned and deposited using PVD, CVD, sputtering, electrolytic plating, electroless plating process, or other suitable metal deposition to form individual portions or sections 242a-242h. The individual portions of conductive layer 242 can be electrically common or electrically isolated depending on the connectivity of the individual semiconductor die. Conductive layer 242 can be one or more layers of Al, Cu, Sn, Ni, Au, Ag, or other suitable electrically conductive material.

A resistive layer 244 is patterned and deposited over conductive layer 242b and between conductive layer 242e and 242f using PVD or CVD. Resistive layer 244 is tantalum silicide (TaxSiy) or other metal silicides, TaN, nickel chromium (NiCr), TiN, or doped poly-silicon having a resistivity between 5 and 100 ohm/sq. An insulating layer 246 is formed over resistive layer 244 using PVD, CVD, printing, sintering, or thermal oxidation. The insulating layer 246 can be one or more layers of Si3N4, SiO2, SiON, Ta2O5, ZnO, ZrO2, Al2O3, polyimide, benzocyclobutene (BCB), polybenzoxazoles (PBO), or other suitable dielectric material. Resistive layer 244 and insulating layer 246 can be formed with the same mask and etched at the same time. Alternatively, resistive layer 244 and insulating layer 246 can be patterned and etched with a different mask.

An insulating or passivation layer 248 is formed over resistive layer 244, insulating layer 246, and conductive layer 242 using spin coating, PVD, CVD, printing, sintering, or thermal oxidation. The passivation layer 248 can be one or more layers of SiO2, Si3N4, SiON, Ta2O5, Al2O3, or other material having suitable insulating properties. A portion of passivation layer 248 is removed to expose conductive layer 242, resistive layer 244, and insulating layer 246.

An electrically conductive layer 252 is patterned and deposited over conductive layer 242, resistive layer 244, insulating layer 246, and passivation layer 248 using PVD, CVD, sputtering, electrolytic plating, electroless plating process, or other suitable metal deposition process to form individual portions or sections which can be electrically common or electrically isolated depending on the connectivity of the individual semiconductor die. Conductive layer 252 can be one or more layers of Al, Cu, Sn, Ni, Au, Ag, or other suitable electrically conductive material.

An insulating or passivation layer 254 is formed over conductive layer 252 and insulating layer 248 using spin coating, PVD, CVD, printing, sintering, or thermal oxidation. The passivation layer 254 can be one or more layers of SiO2, Si3N4, SiON, Ta2O5, Al2O3, or other material having suitable insulating properties. A portion of passivation layer 254 is removed to expose conductive layer 252.

The structures described in build-up interconnect structure 240 constitute one or more passive circuit elements or IPDs. In one embodiment, conductive layer 242b, resistive layer 244, insulating layer 246, and conductive layer 252 is a metal-insulator-metal (MIM) capacitor. Resistive layer 244 between conductive layer 242e-242f is a resistor element in the passive circuit. The individual sections of conductive layer 252 can be wound or coiled in plan-view to produce or exhibit the desired properties of an inductor. The IPD structure provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

A plurality of semiconductor die or components 214 is mounted to the build-up interconnect structure 240 in a flip-chip arrangement with contact pads 216 oriented downward over the carrier. Semiconductor die 214 includes an active surface 218 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 218 to implement baseband analog circuits or digital circuits, such as DSP, ASIC, memory, or other signal processing circuit. Semiconductor die 214 may also contain IPD, such as inductors, capacitors, and resistors, for RF signal processing. In another embodiment, a discrete semiconductor component is mounted to the build-up interconnect structure 240.

A plurality of stud bumps 220 are formed over conductive layer 252. Stud bumps 220 are electrically connected to conductive layer 252 and contact pads 216 of semiconductor die 214.

An encapsulant or molding compound 228 is deposited over semiconductor die 214 and stud bumps 220 using a paste printing, compressive molding, transfer molding, liquid encapsulant molding, vacuum lamination, or other suitable applicator. Encapsulant 228 can be polymer composite material, such as epoxy resin with filler, epoxy acrylate with filler, or polymer with proper filler. Encapsulant 228 is non-conductive and environmentally protects the semiconductor device from external elements and contaminants. Encapsulant 228 undergoes grinding or plasma etching to planarize the surface and expose stud bumps 220.

A topside build-up interconnect structure 230 is formed over encapsulant 228. The build-up interconnect structure 230 includes an insulating or passivation layer 232 formed by PVD, CVD, printing, spin coating, spray coating, sintering, or thermal oxidation. A portion of passivation layer 232 is removed by an etching process to expose stud bumps 220. An electrically conductive layer 234 is formed over passivation layer 232 and stud bumps 220. A portion of conductive layer 234 is electrically connected to stud bumps 220. Other portions of conductive layer 234 can be electrically common or electrically isolated depending on the design and function of the semiconductor device. An insulating or passivation layer 236 is formed over passivation layer 232 and conductive layer 234. A portion of insulating layer 236 is removed by an etching process to expose conductive layer 234.

The carrier is removed by chemical etching, mechanical peel-off, CMP, mechanical grinding, thermal bake, laser scanning, or wet stripping.

An insulating or passivation layer 258 is formed over conductive layers 242 and insulating layer 248 using spin coating, PVD, CVD, printing, sintering, or thermal oxidation. The passivation layer 258 can be one or more layers of SiO2, Si3N4, SiON, Ta2O5, Al2O3, or other material having suitable insulating properties. A portion of passivation layer 258 is removed to expose conductive layer 242.

An electrically conductive layer 260 is formed over conductive layer 242 using patterning with PVD, CVD, sputtering, electrolytic plating, electroless plating process, or other suitable metal deposition process. Conductive layer 260 can be one or more layers of Al, Cu, Sn, Ni, Au, Ag, or other suitable electrically conductive material.

An electrically conductive bump material is deposited over conductive layer 260 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 260 using a suitable attachment or bonding process. In one embodiment, the bump material is reflowed by heating the material above its melting point to form spherical balls or bumps 262. In some applications, bumps 262 are reflowed a second time to improve electrical contact to conductive layer 260. The bumps can also be compression bonded to conductive layer 260. Bumps 262 represent one type of interconnect structure that can be formed over conductive layer 260. The interconnect structure can also use bond wires, conductive paste, stud bump, micro bump, or other electrical interconnect Semiconductor device 210 is stackable. Stud bumps 220 provide vertical, z-direction interconnect between topside build-up interconnect layer 230 and bottom-side build-up interconnect layer 240. Conductive layer 234 is electrically connected through stud bumps 220 to conductive layer 252 and contact pads 216 of semiconductor die 214.

Figure 8:
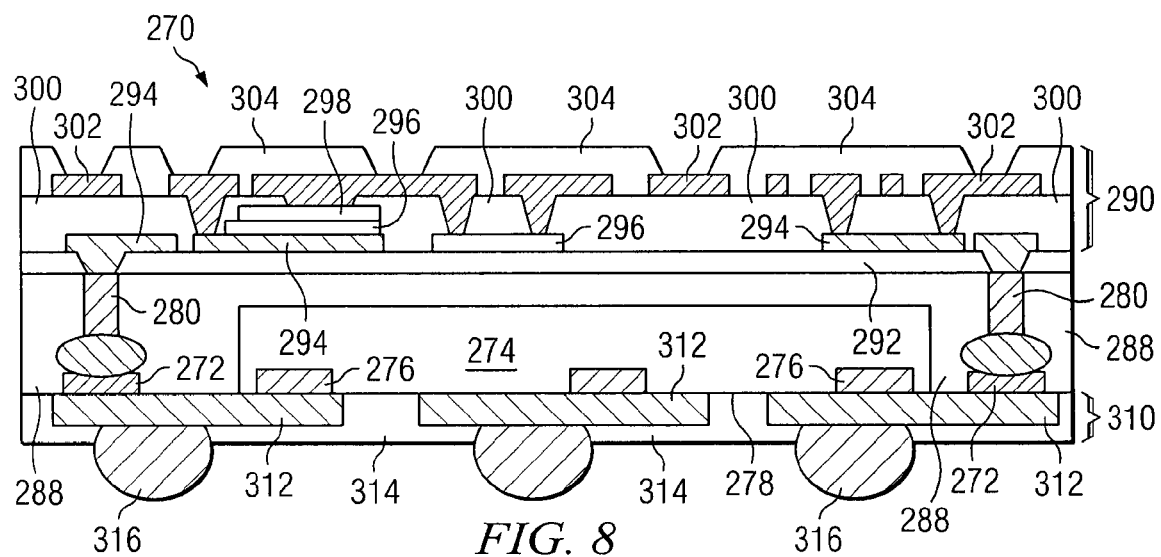
FIG. 8 illustrates the semiconductor device with IPD formed in a topside interconnect structure.

FIG. 8 illustrates an embodiment of the vertical interconnect structure with one or more IPD formed in the topside interconnect structure. Similar to the process described in FIGS. 3a-3h, semiconductor device 270 uses a temporary substrate or carrier with an optional interface layer, which operates as an etch-stop layer. An electrically conductive layer 272 is formed over the carrier using patterning with PVD, CVD, sputtering, electrolytic plating, electroless plating process, or other suitable metal deposition process. Conductive layer 272 can be one or more layers of Al, Cu, Sn, Ni, Au, Ag, W, poly-silicon, or other suitable electrically conductive material. Conductive layer 272 includes wettable contact pads for later formation of stud bumps.

A plurality of semiconductor die or components 274 is mounted to the carrier in a flipchip arrangement with contact pads 276 oriented downward. Semiconductor die 274 includes an active surface 278 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 278 to implement baseband analog circuits or digital circuits, such as DSP, ASIC, memory, or other signal processing circuit. Semiconductor die 274 may also contain IPD, such as inductors, capacitors, and resistors, for RF signal processing. In another embodiment, a discrete semiconductor component is mounted to the carrier or interface layer.

A plurality of stud bumps 280 are formed over the wettable contact pads of conductive layer 272. An encapsulant or molding compound 288 is deposited over semiconductor die 274 and stud bumps 280 using a paste printing, compressive molding, transfer molding, liquid encapsulant molding, vacuum lamination, or other suitable applicator. Encapsulant 288 can be polymer composite material, such as epoxy resin with filler, epoxy acrylate with filler, or polymer with proper filler. Encapsulant 288 is non-conductive and environmentally protects the semiconductor device from external elements and contaminants. Encapsulant 288 undergoes grinding or plasma etching to planarize the surface and expose stud bumps 280.

A topside build-up interconnect structure 290 is formed over a first surface of encapsulant 288. An insulating or passivation layer 292 is formed over encapsulant 288 and stud bumps 280 using spin coating, PVD, CVD, printing, sintering, or thermal oxidation. The passivation layer 292 can be one or more layers of SiO2, Si3N4, SiON, Ta2O5, Al2O3, or other material having suitable insulating properties. A portion of passivation layer 292 is removed to expose stud bumps 280.

An electrically conductive layer 294 is formed over insulating layer 292 using patterning with PVD, CVD, sputtering, electrolytic plating, electroless plating process, or other suitable metal deposition process to form individual portions or sections. The individual portions of conductive layer 294 can be electrically common or electrically isolated depending on the connectivity of the individual semiconductor die. Conductive layer 294 can be one or more layers of Al, Cu, Sn, Ni, Au, Ag, or other suitable electrically conductive material. One portion of conductive layer 294 is electrically connected to stud bump 280. Other portions of conductive layer 294 can be electrically common or electrically isolated depending on the design and function of the semiconductor device.

A resistive layer 296 is patterned and deposited over conductive layer 294 and insulating layer 292 using PVD or CVD. Resistive layer 296 is TaxSiy or other metal silicides, TaN, NiCr, TiN, or doped poly-silicon having a resistivity between 5 and 100 ohm/sq. An insulating layer 298 is formed over resistive layer 296 using PVD, CVD, printing, sintering, or thermal oxidation. The insulating layer 298 can be one or more layers of Si3N4, SiO2, SiON, Ta2O5, ZnO, ZrO2, Al2O3, polyimide, BCB, PBO, or other suitable dielectric material.

An insulating or passivation layer 300 is formed over passivation layer 292, conductive layer 294, resistive layer 296, and insulating layer 298 using spin coating, PVD, CVD, printing, sintering, or thermal oxidation. The passivation layer 300 can be one or more layers of SiO2, Si3N4, SiON, Ta2O5, Al2O3, or other material having suitable insulating properties. A portion of passivation layer 300 is removed to expose conductive layer 294, resistive layer 296, and insulating layer 298.

An electrically conductive layer 302 is patterned and deposited over passivation layer 300, conductive layer 294, and resistive layer 296 using PVD, CVD, sputtering, electrolytic plating, electroless plating process, or other suitable metal deposition process to form individual portions or sections for further interconnectivity. The individual portions of conductive layer 302 can be electrically common or electrically isolated depending on the connectivity of the individual semiconductor die. Conductive layer 302 can be one or more layers of Al, Cu, Sn, Ni, Au, Ag, or other suitable electrically conductive material.

An insulating or passivation layer 304 is formed over conductive layers 302 and passivation layer 300 using spin coating, PVD, CVD, printing, sintering, or thermal oxidation. The passivation layer 304 can be one or more layers of SiO2, Si3N4, SiON, Ta2O5, Al2O3, or other material having suitable insulating properties. A portion of passivation layer 304 is removed to expose conductive layer 302.

The structures described in build-up interconnect structure 290 constitute one or more passive circuit elements or IPDs. In one embodiment, conductive layer 294, resistive layer 296, insulating layer 298, and conductive layer 302 is a MIM capacitor. Resistive layer 296 is also a resistor element in the passive circuit. Other individual sections of conductive layer 302 can be wound or coiled in plan-view to produce or exhibit the desired properties of an inductor.

The carrier and interface layer are removed by chemical etching, mechanical peel-off, CMP, mechanical grinding, thermal bake, laser scanning, or wet stripping. A bottom-side build-up interconnect structure 310 is formed over a second surface of encapsulant 288, opposite topside build-up interconnect structure 290, and the front surface of semiconductor die 274. An electrically conductive layer 312 is formed over conductive layer 272 and the front surface of semiconductor die 274. One portion of conductive layer 312 is electrically connected to stud bumps 280. Other portions of conductive layer 312 can be electrically common or electrically isolated depending on the design and function of the semiconductor device. An insulating or passivation layer 314 is formed over conductive layer 312 and the front surface of semiconductor die 274. A portion of insulating layer 314 is removed by an etching process to expose conductive layer 312.

An electrically conductive bump material is deposited over conductive layer 312 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 312 using a suitable attachment or bonding process. In one embodiment, the bump material is reflowed by heating the material above its melting point to form spherical balls or bumps 316. In some applications, bumps 316 are reflowed a second time to improve electrical contact to conductive layer 312. The bumps can also be compression bonded to conductive layer 312. Bumps 316 represent one type of interconnect structure that can be formed over conductive layer 312. The interconnect structure can also use bond wires, conductive paste, stud bump, micro bump, or other electrical interconnect Semiconductor device 270 is stackable. Stud bumps 280 provide vertical, z-direction interconnect between topside build-up interconnect layer 290 and bottom-side build-up interconnect layer 310. Conductive layers 294 and 302 are electrically connected through stud bumps 280 to conductive layer 312 and contact pads 276 of semiconductor die 274.

Figure 9:
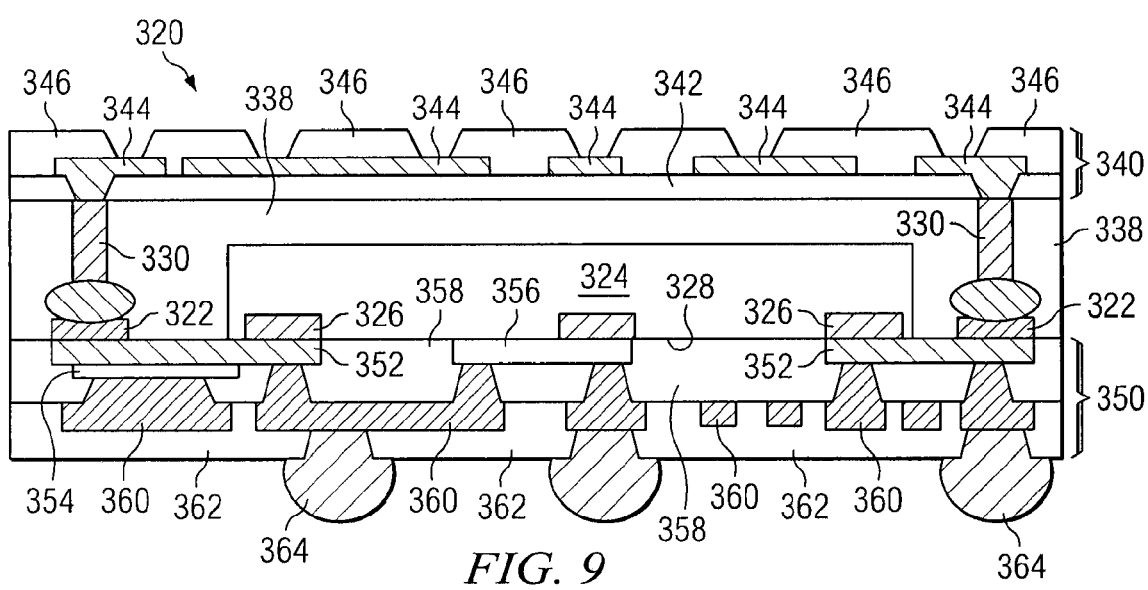
FIG. 9 illustrates another embodiment of the semiconductor device with IPD formed in the bottom-side interconnect structure.

FIG. 9 illustrates an alternate embodiment of the vertical interconnect structure with one or more IPD formed in the bottom-side interconnect structure after encapsulation. Similar to the process described in FIGS. 3a-3h, semiconductor device 320 uses a temporary substrate or carrier with an optional interface layer, which operates as an etch-stop layer. An electrically conductive layer 322 is formed over the carrier using patterning with PVD, CVD, sputtering, electrolytic plating, electroless plating process, or other suitable metal deposition process. Conductive layer 322 can be one or more layers of Al, Cu, Sn, Ni, Au, Ag, W, poly-silicon, or other suitable electrically conductive material. Conductive layer 322 includes wettable contact pads for later formation of stud bumps.

A plurality of semiconductor die or components 324 is mounted to the carrier in a flipchip arrangement with contact pads 326 oriented downward. Semiconductor die 324 includes an active surface 328 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 328 to implement baseband analog circuits or digital circuits, such as DSP, ASIC, memory, or other signal processing circuit. Semiconductor die 324 may also contain IPD, such as inductors, capacitors, and resistors, for RF signal processing. In another embodiment, a discrete semiconductor component is mounted to the carrier or interface layer.

A plurality of stud bumps 330 are formed over the wettable contact pads of conductive layer 322. An encapsulant or molding compound 338 is deposited over semiconductor die 324 and stud bumps 330 using a paste printing, compressive molding, transfer molding, liquid encapsulant molding, vacuum lamination, or other suitable applicator. Encapsulant 338 can be polymer composite material, such as epoxy resin with filler, epoxy acrylate with filler, or polymer with proper filler. Encapsulant 338 is non-conductive and environmentally protects the semiconductor device from external elements and contaminants. Encapsulant 338 undergoes grinding or plasma etching to planarize and expose stud bumps 330.

A topside build-up interconnect structure 340 is formed over a first surface of encapsulant 338. The build-up interconnect structure 340 includes an insulating or passivation layer 342 formed by PVD, CVD, printing, spin coating, spray coating, sintering, or thermal oxidation. A portion of passivation layer 342 is removed by an etching process to expose stud bumps 330. An electrically conductive layer 344 is formed over passivation layer 342 and stud bumps 330. A portion of conductive layer 344 is electrically connected to stud bumps 330. Other portions of conductive layer 344 can be electrically common or electrically isolated depending on the design and function of the semiconductor device. An insulating or passivation layer 346 is formed over passivation layer 342 and conductive layer 344. A portion of insulating layer 346 is removed by an etching process to expose conductive layer 344.

The carrier and interface layer are removed by chemical etching, mechanical peel-off, CMP, mechanical grinding, thermal bake, laser scanning, or wet stripping. A bottom-side build-up interconnect structure 350 is formed over a second surface of encapsulant 338, opposite topside build-up interconnect structure 340, and the front surface of semiconductor die 324. An electrically conductive layer 352 is patterned and deposited using PVD, CVD, sputtering, electrolytic plating, electroless plating process, or other suitable metal deposition process. The individual portions of conductive layer 352 can be electrically common or electrically isolated depending on the connectivity of the individual semiconductor die. Conductive layer 352 can be one or more layers of Al, Cu, Sn, Ni, Au, Ag, or other suitable electrically conductive material. Conductive layer 352 is electrically connected to stud bumps 330 and contact pads 326 of semiconductor die 324.

An insulating layer 354 is formed over conductive layer 352 using PVD, CVD, printing, sintering, or thermal oxidation. The insulating layer 354 can be one or more layers of Si3N4, SiO2, SiON, Ta2O5, ZnO, ZrO2, Al2O3, polyimide, BCB, PBO, or other suitable dielectric material.

A resistive layer 356 is patterned and deposited using PVD or CVD. Resistive layer 356 is TaxSiy or other metal silicides, TaN, NiCr, TiN, or doped poly-silicon having a resistivity between 5 and 100 ohm/sq.

An insulating or passivation layer 358 is formed over insulating layer 354, resistive layer 356, and conductive layer 352 using spin coating, PVD, CVD, printing, sintering, or thermal oxidation. The passivation layer 358 can be one or more layers of SiO2, Si3N4, SiON, Ta2O5, Al2O3, or other material having suitable insulating properties. A portion of passivation layer 358 is removed to expose conductive layer 352, insulating layer 354, and resistive layer 356.

An electrically conductive layer 360 is patterned and deposited over conductive layer 352, insulating layer 354, resistive layer 356, and passivation layer 358 using PVD, CVD, sputtering, electrolytic plating, electroless plating process, or other suitable metal deposition process to form individual portions or sections which can be electrically common or electrically isolated depending on the connectivity of the individual semiconductor die. Conductive layer 360 can be one or more layers of Al, Cu, Sn, Ni, Au, Ag, or other suitable electrically conductive material.

An insulating or passivation layer 362 is formed over conductive layers 360 and insulating layer 358 using spin coating, PVD, CVD, printing, sintering, or thermal oxidation. The passivation layer 362 can be one or more layers of SiO2, Si3N4, SiON, Ta2O5, Al2O3, or other material having suitable insulating properties. A portion of passivation layer 362 is removed to expose conductive layer 360.

The structures described in build-up interconnect structure 330 constitute one or more passive circuit elements or IPDs. In one embodiment, conductive layer 352, insulating layer 354, and conductive layer 360 is a MIM capacitor. Resistive layer 356 is a resistor element in the passive circuit. The individual sections of conductive layer 360 can be wound or coiled in plan-view to produce or exhibit the desired properties of an inductor.

An electrically conductive bump material is deposited over conductive layer 360 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 360 using a suitable attachment or bonding process. In one embodiment, the bump material is reflowed by heating the material above its melting point to form spherical balls or bumps 364. In some applications, bumps 139 are reflowed a second time to improve electrical contact to conductive layer 360. The bumps can also be compression bonded to conductive layer 360. Bumps 364 represent one type of interconnect structure that can be formed over conductive layer 360. The interconnect structure can also use bond wires, conductive paste, stud bump, micro bump, or other electrical interconnect Semiconductor device 320 is stackable. Stud bumps 330 provide vertical, z-direction interconnect between topside build-up interconnect layer 340 and bottom-side build-up interconnect layer 350. Conductive layer 344 is electrically connected through stud bumps 330 to conductive layers 352 and 360 and contact pads 326 of semiconductor die 324.

As demonstrated by FIGS. 7-9, the IPDs can be formed in either or both of the topside build-up interconnect structure and bottom-side build-up interconnect structure.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die or component;
a vertical interconnect structure formed adjacent to the semiconductor die or component, the vertical interconnect structure including a bump portion and a stud portion extending from the bump portion;
an encapsulant deposited over the semiconductor die or component and around the vertical interconnect structure; and
a first interconnect structure formed over a first surface of the encapsulant, the first interconnect structure including a plurality of conductive layers and an insulating layer which form a first integrated passive device (IPD).

2. The semiconductor device of claim 1, further including a second interconnect structure formed over a second surface of the encapsulant opposite the first interconnect structure.

3. The semiconductor device of claim 1, wherein the first interconnect structure includes a second IPD.

4. The semiconductor device of claim 1, further including a plurality of stacked semiconductor devices electrically connected through the vertical interconnect structure.

5. A semiconductor device, comprising:
a semiconductor die or component;
a stud bump disposed adjacent to the semiconductor die or component, the stud bump including a bump portion and a stud portion extending from the bump portion;
an encapsulant disposed over the semiconductor die or component and stud bump with the stud portion of the stud bump extending through the encapsulant;
a first interconnect structure formed over a first surface of the encapsulant and contacting the stud portion of the stud bump; and
a second interconnect structure formed over a second surface of the encapsulant opposite the first surface of the encapsulant and coupled to the first interconnect structure through the stud bump.

6. The semiconductor device of claim 5, wherein the first interconnect structure includes a first integrated passive device (IPD) and the second interconnect structure includes a second IPD.

7. The semiconductor device of claim 5, further including a contact pad disposed over the stud bump.

8. The semiconductor device of claim 5, further including a plurality of stacked semiconductor devices electrically connected through the first interconnect structure, second interconnect structure, and stud bump.

9. The semiconductor device of claim 5, further including a third interconnect structure formed over the semiconductor die or component and electrically connected to the first interconnect structure.

10. A semiconductor device, comprising:
a semiconductor die or component;
a stud bump formed adjacent to the semiconductor die or component;
a first interconnect structure formed over a first surface of the semiconductor die or component and coupled to the stud bump; and
a second interconnect structure formed over a second surface of the semiconductor die or component opposite the first surface of the semiconductor die and coupled to the first interconnect structure through the stud bump.

11. The semiconductor device of claim 10, wherein the first interconnect structure includes a first integrated passive device (IPD) and the second interconnect structure includes a second IPD.

12. The semiconductor device of claim 10, wherein the stud bump includes a plurality of stacked bumps.

13. A semiconductor device, comprising:
a first interconnect structure including a first integrated passive device (IPD);
a stud bump formed over the first interconnect structure;
a semiconductor die or component disposed over the first interconnect structure;
an encapsulant formed over the semiconductor die or component and around the stud bump; and
a second interconnect structure formed over the encapsulant opposite the first interconnect structure.

14. The semiconductor device of claim 13, further including a plurality of stacked semiconductor devices electrically connected through the stud bump.

15. The semiconductor device of claim 13, wherein the semiconductor die or component includes a flipchip semiconductor die including an active surface oriented toward the first interconnect structure.

* * * * *